United States Patent
Sugioka

(10) Patent No.: US 6,386,685 B1
(45) Date of Patent: May 14, 2002

(54) INK JET RECORDING HEAD, INK JET APPARATUS PROVIDED WITH THE SAME, AND INK JET RECORDING METHOD

(75) Inventor: Hideyuki Sugioka, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/407,302

(22) Filed: Sep. 29, 1999

(30) Foreign Application Priority Data

| Sep. 30, 1998 | (JP) | 10-277881 |
| Jul. 2, 1999 | (JP) | 11-189394 |
| Sep. 20, 1999 | (JP) | 11-265649 |

(51) Int. Cl.[7] .................................................. B41J 2/05
(52) U.S. Cl. ................................................ 347/61
(58) Field of Search ........................... 347/63, 62, 64

(56) References Cited

U.S. PATENT DOCUMENTS

| 4,523,811 A | 6/1985 | Ota ............................ 350/333 |
| 5,144,288 A | 9/1992 | Hamada et al. .............. 340/702 |
| 5,335,101 A | 8/1994 | Reamey ....................... 359/52 |

FOREIGN PATENT DOCUMENTS

| EP | 0 432 982 A1 | 6/1991 |
| EP | 0 493 897 A2 | 7/1992 |
| EP | 0 536 732 A1 | 4/1993 |
| EP | 0 641 656 A2 | 3/1995 |
| JP | 57-36679 | 2/1982 |
| JP | 62-201254 | 9/1987 |
| JP | 64-20151 | 1/1989 |
| JP | 5-242793 | 9/1993 |
| JP | 5-301345 | 11/1993 |
| JP | 8-156269 | 6/1996 |

OTHER PUBLICATIONS

English–language abstract of Japanese Patent 10050208, dated Feb. 20, 1998.
Patent Abstracts of Japan, vol. 1998, No. 10, Aug. 31, 1998 (JP 10 114072, May 6, 1998).
Patent Abstracts of Japan, vol. 1998, No. 11, Sep. 30, 1998 (JP 10 157112, Jun. 16, 1998).
Patent Abstracts of Japan, vol. 016, No. 492, Oct. 12, 1992 (JP 04 180261, Jun. 26, 1992).

*Primary Examiner*—John Barlow
*Assistant Examiner*—Michael Brooke
(74) *Attorney, Agent, or Firm*—Fitzpatrick, Cella, Harper & Scinto

(57) ABSTRACT

This invention provides an ink jet recording head for discharging an ink droplet using the thermal energy of heating means. According to the present invention, the heating means is a heating device having the Metal-Insulator-Metal type current-voltage properties in which the resistance value on the application of a low voltage exhibits a value higher than the resistance value on the application of a high voltage, regardless of the polarity.

18 Claims, 8 Drawing Sheets

(MIM-TYPE CURRENT-VOLTAGE PROPERTIES)

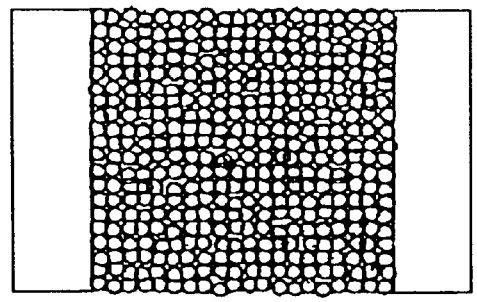
FIG. 10A
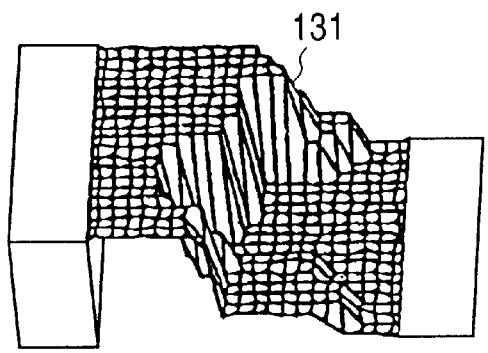
FIG. 10B
FIG. 11
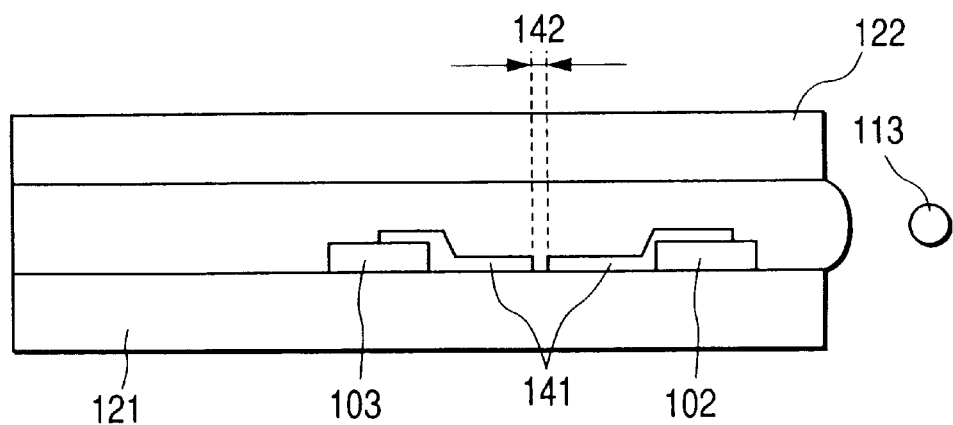

INK JET RECORDING HEAD, INK JET APPARATUS PROVIDED WITH THE SAME, AND INK JET RECORDING METHOD

BACKGROUND OF THE INVENTION

1. Field of the Invention

The present invention relates to an ink jet recording head and an ink jet recording method which are applied to an ink jet printer, particularly a bubble jet printer using bubbling phenomena, and the like.

2. Related Background Art

A bubble jet recording method is a recording method in which ink in a liquid path is locally heated to a high temperature by heating means to bubble the ink, pushing the ink out of a discharge port by a high pressure generated during bubbling, and allowing the ink to be deposited to a recording medium such as a recording paper and the like. A recording head applied to a bubble jet recording method generally includes fine structures such as a discharge port, a liquid path, heating means provided at a portion of the liquid path and used as an ink discharge energy generation portion, and the like.

In such bubble jet recording methods, as an ink jet recording head which discharges ink from discharge ports provided in a matrix in accordance with heating means, with heating means arranged longitudinally and transversely in a matrix in plural numbers, Japanese Patent Application Laid-Open No. 64-20151 discloses an ink jet recording head which disposes a plurality of longitudinal wiring and transverse wiring on a substrate, and includes a rectifying device through which an electric current is flowed only when a forward voltage is applied and an electric current is not flowed by the application of reverse voltage, and a heating resistor used as heating means connected to the rectifying device on the crossing portions of the longitudinal wiring and the transverse wiring. In this ink jet recording head, a voltage is applied to any of longitudinal wiring and any of transverse wiring to apply a forward voltage to a heating resistor on the crossing portion of the longitudinal wiring and the transverse wiring, so that this heating resistor is driven. In this case, to other heating resistors is flowed no electric current while keeping states where no voltage is applied thereto, or a reverse voltage is applied thereto. Thus, a predetermined heating resistor of a plurality of heating resistors is driven.

Further, Japanese Patent Application Laid-Open No. 57-36679 discloses an ink jet recording head in which a diode, which is heated by the energization of forward current and which a reverse current cannot be energized, is used as heating means, and these diodes are arranged in a matrix in the plural numbers on a substrate.

Further, in an ink jet recording head, an about 0.05 μm thick tantalum nitride ($Ta_xN_y$) thin-film resistor is usually used as heating means, and ink is heated and bubbled by the Joule heat generated when electric current is energized through this thin-film resistor. On such a thin-film resistor is usually provided an about 0.2 μm thick cavitation-resisting layer composed of a metal such as Ta or the like through an about 0.8 μm thick insulator of SiN or the like, to prevent damage of the surface of the thin-film resistor due to cavitation. As a method of forming the cavitation-resisting layer, a method of laminating three protective layers on a heating resistor, and the like have been proposed (refer to Japanese Patent Application Laid-Open No. 5-301345 and the like).

To make high definition images recordable by an ink jet recording method, a technique of discharging as minute an ink droplet as possible with high density is required. For the sake of this, it is basically important to form a fine liquid path and fine heating means.

As a method of forming such fine structures, a method of producing a high density recording head using the photolithography technology has been proposed, which utilizes the simplicity of the recording head structure in a bubble jet recording method (refer to Japanese Patent Application Laid-Open No. 8-156269 and the like).

Further, as a method of discharging a minute or fine ink droplet, the method using heating means having the heat value larger at the center portion compared to that in the edge portions has been proposed (refer to Japanese Patent Application Laid-Open No. 62-201254).

In a conventional ink jet recording head, when a plurality of heating means are selectively driven, a noise voltage is applied to non-selected heating means to waste energy and affect the driving voltage thereby to change the discharging amount of ink and possibly affect recording images. Particularly, in an ink jet recording head, in which a voltage is applied to a plurality of longitudinal wiring and a plurality of transverse wiring so that heating means provided in a matrix on the crossing of the longitudinal wiring and the transverse wiring are selectively driven, a voltage lower than the driving voltage is possibly applied to non-selected heating means, and when this voltage is applied in the forward direction, non-required heat is generated in non-selected heating means.

When a cavitation-resisting layer is provided on a heating resistor, the heating resistor indirectly contacts ink through the cavitation-resisting layer, and the cavitation-resisting layer prevents the heat transfer to the ink, whereby the heat is difficult to transfer to the ink. Thus, the application of electric energy is further required compared to a case where a cavitation-resisting layer is not provided, and the consumption electric power may be increased.

On the other hand, another method is known, in which a cavitation-resisting layer is not provided and a layer itself composed of a metal having the cavitation-resisting properties is used as a heating resistor. However, since the specific resistance of the metal having the cavitation-resisting properties is usually low (for example, the specific resistance of Ta is $2\times10^{-6}$ Ωcm), when this metal film thickness is increased, the area of a conducting path is increased and the resistance is excessively reduced, whereby the function of the heating resistor is not effected. Therefore, in a method in which a layer itself composed of a metal having the cavitation-resisting properties is used as a heating resistor, to use the metal layer having a sufficiently increased film thickness is difficult.

Further, when a cavitation-resisting layer having a decreased film thickness is formed to improved the heat transfer, the functions of a heating resistor are possibly lost by the generation of a pin-hole due to cavitation or the like.

Further, in a case where the size of a heater is decreased to allow a fine ink droplet to discharge, when the heater portion and the wiring portion connected to the heater are miniaturized in the same ratio as the heater is miniaturized, an increase of the wiring resistance is invited. Thus, the miniaturization of the heater portion and the like has limitations.

Further, although the photolithography technology is excellent in the working precision, it is inferior in a mass production. On the contrary, although the printing technology is advantageous in a mass production, it is inferior in the working precision. That is, when a heater or the like is finely formed for the purpose of discharging a minute liquid droplet, it is difficult to satisfy both of the precision and mass productivity.

SUMMARY OF THE INVENTION

One object of the present invention is to provide an ink jet recording head providing heating means which does not generate non-required heat even though a voltage such as a noise voltage lower than the driving voltage is applied to the heating means.

Further, another object of the present invention is to provide an ink jet recording head which has a resistance to cavitation and has a small consumption electric power.

Still another object of the present invention is to provide a liquid discharge device which can heat a minute spot-shaped area even when a heater film area cannot be formed in a sufficiently small size, and can discharge a minute liquid droplet, and is to provide an ink jet recording head and an ink jet apparatus, which have this liquid discharge device and can perform high precision recording.

An ink jet recording head according to the present invention, which discharges an ink droplet using the thermal energy from heating means is characterized in that the heating means is a heating device having MIM (Metal-Insulator-Metal)-type current-voltage properties in which the resistance value when a low voltage is applied shows a higher value compared to the resistance value when a high voltage is applied, regardless of the polarity.

By using a heating device having such an MIM-type current-voltage properties, even though a voltage such as a noise voltage lower than the driving voltage of the heating device is applied to the heating device, the resistance value in the heating device when a low voltage is applied is large. Thus, the electrical current hardly flows in the heating device. Therefore, non-required heat in the heating device can be prevented.

It is preferable that the current-voltage properties of a heating device are those in which current flowed by the application of voltage of a small absolute value is sufficiently small on both the positive voltage side and the negative voltage side so that the heating device is not heated by the noise voltage having an unstable polarity. Thus, it is desirable that in the current-voltage properties of a heating device, particularly, the ratio $(V_1/V_2)$ of absolute values of an applied voltage $+V_1$ to an applied voltage $-V_2$ which provide current of an absolute value $I_0$ corresponding to the current which is flowed through the heating device when the thermal energy required for bubbling ink is generated, is a value of 0.5 or more and 2 or less and that the absolute value of current which is flowed when voltage of $+V_1/2$ or $-V_2/2$ is applied, is $I_0/10$ or less.

Further, an ink jet recording head can be made, which can selectively heat a heating device by selectively applying a voltage to a stripe-shaped electrode by making a structure in which heating devices are arranged in a matrix on the crossing of stripe-shaped electrodes provided longitudinally and transversely so as to cross each other. In this case, even though a voltage lower than the driving voltage of the heating device is applied to some heating devices on non-selected positions, the heating device has MIM-type current-voltage properties. Accordingly, current is hardly flowed through the heating device and the heating device is not heated.

Such a heating device having the MIM-type current/voltage properties includes an MIM device having an insulator and a pair of conductor electrodes sandwiching the insulator therebetween.

This MIM device can have a configuration that an insulator portion is a heating portion, any one of conductor electrodes sandwiching the insulator acts as an ink contact surface and the ink is heated on the surface. Since the heat value of the MIM device depends on only the thickness of the insulator and the material constant, the thickness of the conductor electrode can be increased without loss of the heating properties of the MIM device. Therefore, the MIM device can be used as cavitation-resisting heating means by increasing the thickness of a conductor electrode surface from which ink is bubbled.

To flow current through an MIM device by the tunnel conduction that is the electric conduction mechanism in an insulator of the MIM device, the space between the electrodes is desirably 100 nm or less. Further, it is desirable to set the space between the electrodes to 20 nm or less so that the MIM device is rapidly heated by the application of a pulse voltage of a short pulse width such as about 1 μsec.

Further, when the space between the electrodes is extremely narrow, ions on the metal surface of the electrode possibly causes the field radiation. Thus, the space between the electrodes is desirably 1 nm or more. Additionally, setting the space between the electrodes to 4 nm or more is more desirable so that a stable tunnel conduction can be obtained.

Further, by forming a conductor electrode surface, from which ink is bubbled, with a metal having cavitation-resisting properties, the cavitation-resisting properties of heating means can be enhanced.

In a conventional ink jet recording head in which a metal having the cavitation-resisting properties is formed on heating means, heat of the heating means is transmitted to ink through the metal having the cavitation-resisting properties and an insulating layer sandwiched between this metal layer and the heating means to electrically insulate them. On the other hand, in an ink jet recording head of the present invention, heat of a heating portion is transmitted only through a metal having the cavitation-resisting properties. Accordingly, the thermal conductivity is improved, and ink can be efficiently bubbled with a reduced consumption electric power.

Further, by forming an oxide insulating film on a conductor electrode surface the durability of the conductor electrode is enhanced and the electrode is further resistant to heat.

As a structure of an MIM device, the MIM device can employ a structure which has a pair of thin-film conductive electrodes spaced on a substrate surface which, at least, is composed of an insulator. That is, in this structure, the space between the conductor electrodes acts as an insulator which causes the tunnel conduction. An insulator may be provided in this space.

As another structure of the MIM device, the MIM device can employ a laminate structure which has a conductor electrode of a metal thin-film disposed on a substrate, a thin-film insulator disposed on the conductor electrode and a conductor electrode of a metal thin-film disposed on the insulator.

An ink jet recording head using an MIM device having the laminate structure can employ a configuration in which heating means are easily disposed in a matrix by forming a configuration having stripe-shaped lower electrodes formed in parallel in a plurality of lines, striped-shaped upper electrodes formed in parallel in a plurality of lines so as to cross the stripe-shaped lower electrodes, and insulators each sandwiched between the stripe-shaped lower electrode and the stripe-shaped upper electrode, and ink is discharged from matrix-shaped discharge ports. That is, in this configuration, an MIM device is formed at the crossing or intersection formed by a stripe-shaped lower electrode and a stripe-shaped upper electrode.

The drive of the MIM device arranged in the matrix is performed by applying a voltage to a stripe-shaped lower electrode and a stripe-shaped upper electrode which pass through an MIM device portion to be driven, to apply an electric potential difference of the voltage applied to both electrodes, to the MIM device. In this case, although an electric potential difference is imparted to the MIM device in which a voltage is applied to only any one of the stripe-shaped upper electrode and the stripe-shaped lower electrode, this electric potential difference is smaller than the electric potential difference applied to the MIM device in which a voltage was applied to both the electrodes. In the MIM device, the amount of change in current is larger than the amount of change in electric potential difference applied. Therefore, even though an electric potential difference smaller than the electric potential difference by which a desired heat value is obtained is applied, current is hardly flowed and the MIM device is hardly heated. That is, a non-required heat value of non-selected MIM device is small.

The ink jet recording head according to the present invention has no necessity to separately provide voltage applying means on each of the MIM devices arranged in a matrix as mentioned above. Thus, a configuration that the voltage applying means for the MIM device is provided in the external portion of the ink jet recording head and that voltage applying means and detachable interface electrode portions are formed in the ink jet recording head, can be easily obtained. That is, the end portions of the stripe-shaped lower electrode and stripe-shaped upper electrode are disposed at the outer regions of the ink jet recording head, so that this outer regions may be used as the external voltage applying means and the detachable interface electrode portion. By forming such a configuration, the manufacturing costs of the ink jet recording head which is necessary to replace due to the consumption of the ink can be reduced.

Other heating devices having the MIM-type current-voltage properties include a varistor in which a sintered body layer to which a metal oxide was added or granular crystal layer was sandwiched with a pair of conductors.

Further, other heating devices having the MIM-type current-voltage properties include a surface conduction type device in which a thin-film resistor, particularly, a fine particle thin-film resistor composed of dispersedly-disposed fine particles, or an island-shaped thin-film resistor was disposed between a pair of device electrodes. This surface conduction type device can employ a configuration that a thin-film resistor having a linear field-concentrated region during the energization of current is used. By using such a surface conduction device as heating means, the thin-film resistor can form the linear field-concentrated region during the energization of current. Accordingly, even though this thin-film resistor is composed of a film having a comparatively large area, the minute spot heating in the field-concentrated region can be effected, whereby a fine liquid droplet can be discharged.

An ink jet recording device according to the present invention is characterized by comprising at least the above-mentioned ink jet recording head provided with ink discharge ports for discharging ink facing the surface of a recording medium, and recording media carrying means.

According to the ink jet recording head of the present invention, non-required heat due to a noise voltage value lower than the driving voltage and the like can be prevented by using a device having MIM-type current-voltage properties as heating means.

Further, according to the present invention, by using the MIM device as heating means in an ink jet recording head, the heating portion can be protected from cavitation, the distance between the heating portion and the ink contact surface can be decreased. Therefore, an ink jet recording head, which is resistant to the cavitation and has a reduced consumption electric power, can be formed.

Further, according to the present invention, by using a surface conduction device characterized by comprising a thin-film resistor disposed between a pair of element electrodes, the thin-film resistor having a linear field-concentrated region during the energization of current, as heating means, even when a film area cannot be formed in sufficiently small size, minute spot heating in the field-concentrated region can be effected, whereby a fine liquid droplet can be discharged.

BRIEF DESCRIPTION OF THE DRAWINGS

FIG. 10A is a schematic view showing the structure of a fine particle film having a fluctuation of the area occupation ratio of fine particles, in a range of 35% to 75% and FIG. 10B is a schematic view showing the simulation-calculated results of the space distribution of an electric field with respect to a fine particle film;

FIG. 11 is a diagram showing a liquid discharge device according to Example 6 of the present invention;

FIG. 12A is a schematic plan view and FIG. 12B is a schematic cross-sectional view.

DETAILED DESCRIPTION OF THE PREFERRED EMBODIMENTS

Embodiments of the present invention will be described below with reference to drawings.

Embodiment 1

Figure 1:
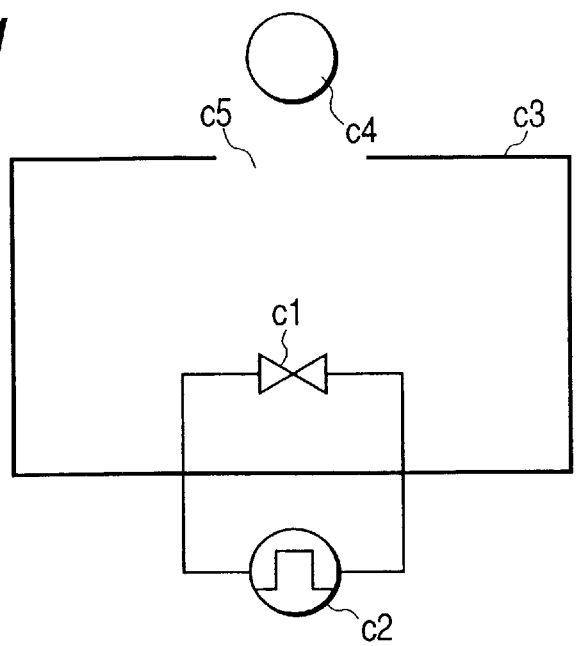
FIG. 1 is a diagram showing an ink jet recording head according to Embodiment 1 of the present invention.

FIG. 1 is a diagram showing the feature of an ink jet recording head according to Embodiment 1 of the present invention.

As shown in FIG. 1, this ink jet recording head includes a liquid chamber c3 which retains a liquid to be discharged, and a two-terminal heating device c1 disposed in the liquid chamber c3. The heating device c1 plays a role of heating means which generates the thermal energy for discharging liquid. That is, by applying a pulse voltage to the heating device c1 with a pulse power supply c2, the heating device c1 is heated to bubble the liquid in the liquid chamber c3, thereby to discharge a liquid droplet c4 from a discharge port c5.

The heating device c1 has MIM (Metal-Insulator-Metal)-type current-voltage properties which exhibit low resistance value at the high voltage side and exhibit high resistance values at the low voltage side regardless of the polarity. Typical devices having such current-voltage properties include an MIM device, a varistor device and the like.

Incidentally, the MIM device is fundamentally a tunnel junction device having an insulator and metals disposed so that the metals sandwich the insulator. However, also, a junction device having an insulator and conductor electrodes disposed so that the electrodes sandwich the insulator is usually called as the MIM device.

As the electric conduction mechanism in the insulator of the MIM device, the hopping type conduction which repeats a plurality of tunneling in an insulator such as the Poole-Frenkel type conduction, and the comparatively simple tunnel conduction such as Fowler Nordheim type conduction, and the like are well-known.

To flow such tunnel-type current and to flow current through a junction device, a distance between electrodes is required to be extremely narrow. The limit insulating film thickness or the limit electrode space, in which current can be flowed through the MIM device, greatly depends on kinds of insulation materials and electrode materials and the conduction mechanism. However, to supply significant current in the MIM device, the electrode space is preferably 100 nm or less. Further, the electrode space is desirably set to 20 nm or less so that the heating device c1 is rapidly heated by the application of a pulse voltage of a short pulse width of about 1 μsec to the heating device c1.

Further, since an extremely narrow electrode space possibly causes the field radiation of ions of a metal surface of the electrode, it is preferable that the electrode space is set to 1 nm or more. Additionally, to obtain the tunnel junction which causes stable tunnel conduction, the electrode space is preferably set to 4 nm or more.

That is, an MIM device having an electrode space of 1 nm or more and 100 nm or less, more preferably, 4 nm or more and 20 nm or less, is preferably used as the heating device c1.

Alternatively, a device in which a sintered body layer of ZnO to which Bi, Pr, Co etc., metal oxides were added, or a granular crystal layer composed of silicon carbide; SiC or the like was disposed between electrodes in place of the insulator in the above-mentioned MIM device, so called a varistor is a device also having the MIM-type current-voltage properties which exhibit low resistance values at the high voltage side and exhibit high resistance values at the low voltage side. This varistor can be used as the heating device c1 of the present invention like the MIM device.

By using the heating device c1 which exhibits such MIM-type current-voltage properties as heating means, even though a voltage lower than the driving voltage of the heating device, such as a noise voltage or the like is applied to the heating device, the resistance values of the heating device c1, which are obtained when a low voltage was applied, are large. Accordingly, current is hardly flowed through the heating device c1. Thus, undesired heating of the heating device c1 can be prevented. Further, fluctuations of the quality of the recording images can be prevented. In this case, the fluctuations are generated by the reasons why the electric energy for driving a required heating device c1 is consumed by undesired heating of another heating device c1, and the electric energy for the heating device c1 to be driven becomes small, whereby a required bubbling is not generated and the discharge amount of liquid is changed.

Figure 2:
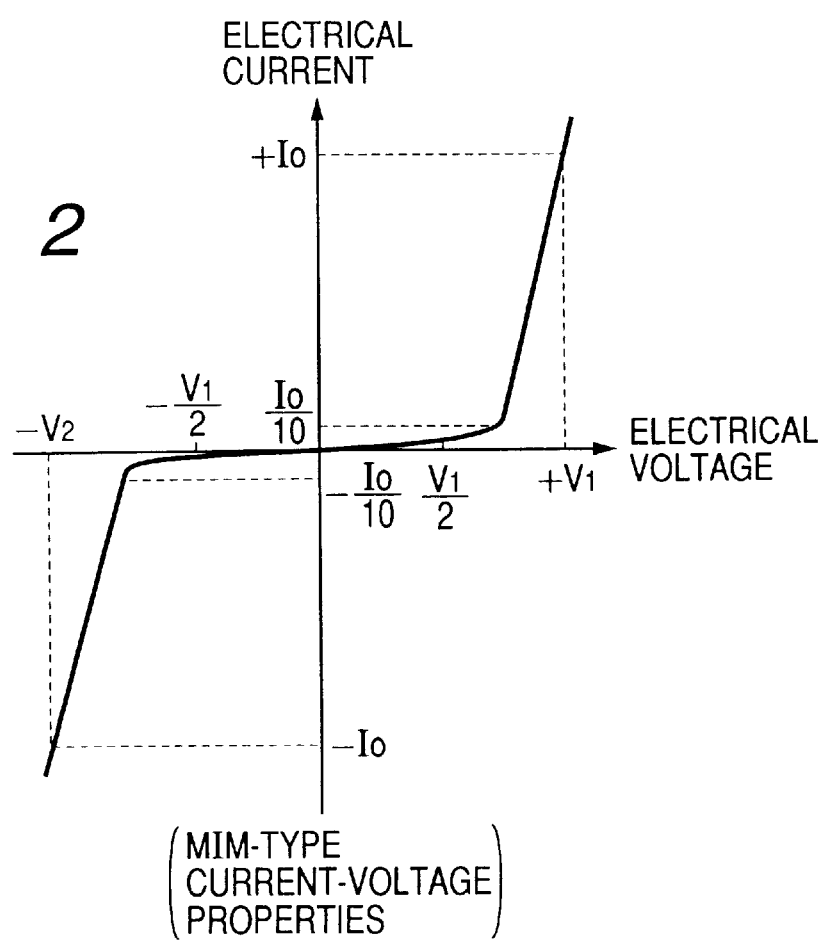
FIG. 2 is a view showing the current-voltage properties of heating means in the ink jet recording head of FIG. 1.

Incidentally, the current-voltage properties of the heating device c1 is preferably those in which by the application of voltages of small absolute values, only a sufficiently small current flows on both the positive voltage side and the negative voltage side so that the heating device c1 is not heated by the noise voltage whose polarity is not determined. Thus, it is desirable that particularly, in the current-voltage properties of the heating device c1, the ratio $(V_1/V_2)$ of absolute values of an applied voltage $+V_1$ to an applied voltage $-V_2$ which provide current of an absolute value $I_0$ corresponding to the current which flows when a voltage is applied so as to generate a required bubbling, is a value of 0.5 to 2, and that the absolute value of current which is flowed when an voltage of $+V_1/2$ or $-V_2/2$ is applied is $I_0/10$ or less, as shown in FIG. 2.

Embodiment 2

Figure 3:
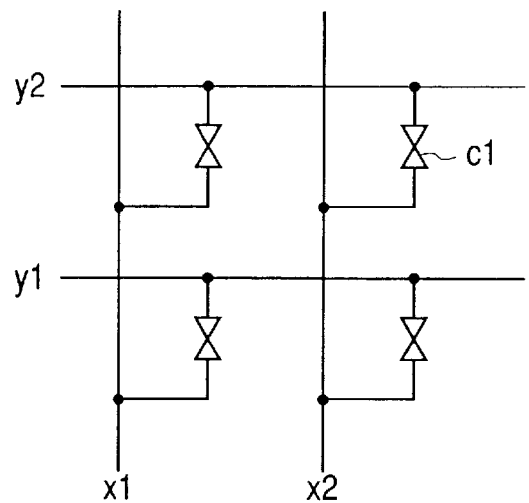
FIG. 3 is a diagram showing the feature of an ink jet recording head according to Embodiment 2 of the present invention.

FIG. 3 is a diagram showing the feature of heating means of an ink jet recording head of Embodiment 2 of the present invention. As shown in FIG. 3, the ink jet recording head of the present embodiment includes stripe-shaped electrodes x1 and x2 disposed in arrays, stripe-shaped electrodes y1 and y2 disposed in arrays so that the electrodes y1 and y2 cross the electrodes x1 and x2, and heating devices c1, disposed on the crossing or intersections of the striped electrodes x1, x2 and the stripe-shaped electrodes y1, y2 in a matrix, which exhibit the MIM-type current-voltage properties.

In this ink jet recording head, by selectively applying a voltage of $+V_3$ to any one of the striped electrodes x1, x2 and applying a voltage of $-V_4$ to any one of the striped electrodes y1, y2, a voltage of $(V_3+V_4)$ is applied to the heating device positioned at the crossing of the stripe-shaped electrodes to which the voltage were applied so that the heating device c1 can be selectively driven or activated.

In this case, a voltage of $V_3$ or $V_4$ is applied to some heating devices c1 on the non-selected points. However, since the heating device c1 has MIM-type current-voltage properties, even though a voltage $V_3$ or $V_4$ smaller than the voltage of $(V_3+V_4)$, which drives the selected heating device c1, is applied, current is hardly flowed through the non-selected heating devices c1 and the non-selected heating devices c1 are not heated. That is, the selective driving of the heating devices c1 arranged in a matrix can be effected.

In the ink jet recording head of the present embodiment, the selective driving of the heating devices c1 arranged in a matrix can be effected by selectively applying voltages to the stripe-shaped electrodes x1, x2, and the stripe-shaped electrodes y1, y2. Therefore, a driver for selectively driving the heating devices c1 can be disposed at the external portion of the ink jet recording head using the end portions of the stripe-shaped electrodes x1, x2, y1 and y2, as the interface portions. Thus, since the formation of complicated circuits is not required in the ink jet recording head, an inexpensive and mass-producible ink jet recording head is made.

Further, an inexpensive non-Si substrate can be used as a substrate on which the heating devices c1 of the ink jet recording head are formed, without the use of a Si substrate which is used in forming complicated circuits.

Further, according to the ink jet recording head of the present embodiment, devices such as a rectifying device provided for selectively driving the heating devices c1 disposed in a matrix shown in the conventional example, other than the heating device c1, are not required in the ink jet recording head. Accordingly, no power loss due to the use of the rectifying device and the like is generated and an ink jet recording head whose power loss is small can be obtained.

Next, Examples which show further concrete configuration of the Embodiments of the present invention will be described.

EXAMPLE 1

Figure 4:
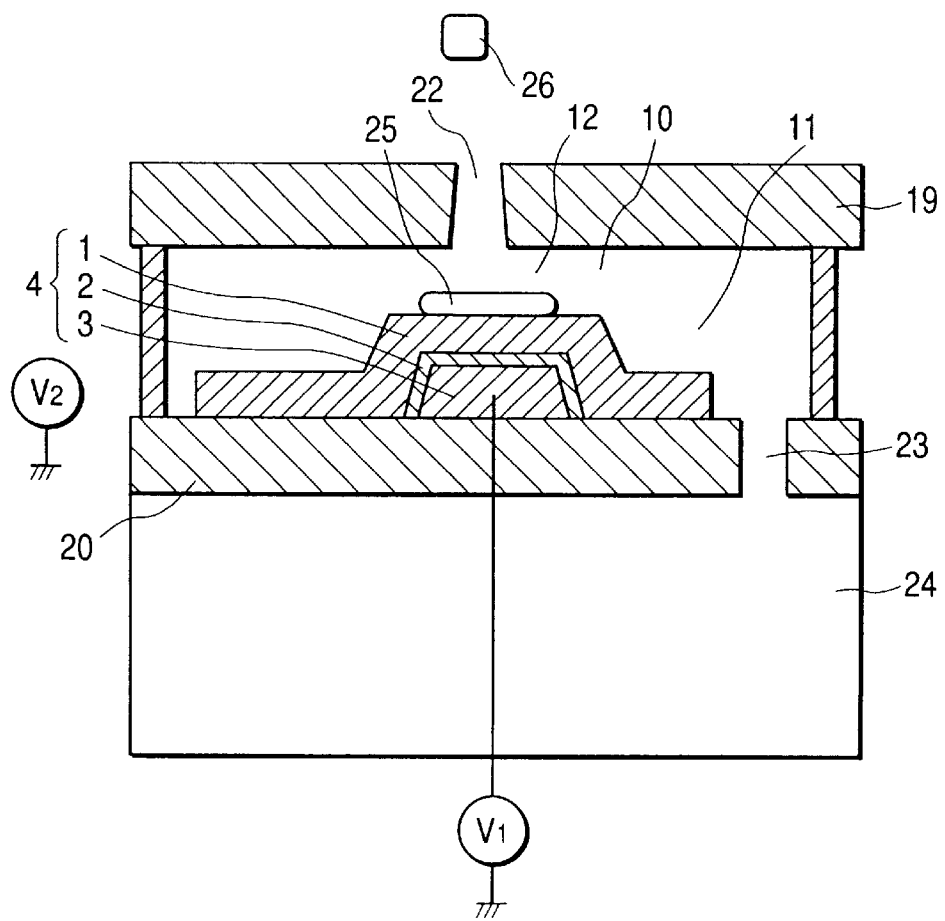
FIG. 4 is a schematic cross-sectional view showing an ink jet recording head according to Example 1 of the present invention.

FIG. 4 is a cross-sectional view showing the feature of an ink jet recording head of Example 1 of the present invention.

As shown in FIG. 4, this ink jet recording head includes a liquid chamber 11 which retains ink 12 in the vicinity of a discharge port 22 perforated in a substrate 19, a liquid path 10 communicating the liquid chamber 11 to the discharge port 22, and an ink tank 24 which stores ink 12 supplied in the liquid chamber 11 through an ink supply hole 23 perforated in an insulation substrate 20. On the insulation substrate 20 in the liquid chamber 11 is formed an MIM (Metal-Insulator-Metal) device 4 which is a laminate of a metal electrode 3 extending in the direction vertical to the sheet of FIG. 4, an insulator 2 formed thereon, and a metal electrode 1 composed of a metal having the cavitation-resisting properties, extending in the left and right directions in FIG. 4. The MIM device 4 plays a role of heating means which is a nonlinear device and heats the ink 12 to bubble, and is disposed at a position opposite to the discharge port 22 in the liquid chamber 11.

Then, a recording method of this ink Jet recording head will be described.

When voltages of V1 and V2 are applied to the metal electrode 3 and the metal electrode 1 having the cavitation-resisting properties, respectively, in the MIM device 4, so that the electric potential difference V (=V2−V1) is generated between both the electrodes, the nonlinear Poole-Frenkel current I which flows in accordance with the potential difference is obtained by the following expressions.

$$I = \alpha V \exp(\beta \sqrt{(V)}) \quad \text{(equation 1)}$$

$$\alpha = ((n\mu q)/d) \exp(-\phi/(k_B T)) \quad \text{(equation 2)}$$

$$\beta = (1/(k_B T))\sqrt{q^3/(\pi \in_i \in_o d)} \quad \text{(equation 3)}$$

(n: carrier density of the insulator 2, $\mu$: mobility of carrier, q: amount of charge of carrier, d: thickness of insulator 2, $\phi$: depth of trap, $k_B$: Boltzmann's constant, T: temperature, $\in_i$: dielectric constant of insulator 2, $\in_o$: dielectric constant of vacuum)

This current I flows between the electrodes, the electric power P (=IV) is consumed to heat, and the ink 12 is bubbled by this heat to generate a bubble 25. Then, an ink droplet 26 is discharged from the discharge port 22 in a direction substantially vertical to the substrate 19, by the increase in the pressure of the ink 12, whereby recording is performed by adhering this ink droplet 26 to a recording medium not shown.

Then, a method of forming the MIM device will be described.

As the insulating substrate 20, a 1 mm thick glass substrate is used. On this glass substrate is deposited, for example, Ta having a width of 40 $\mu$m and a thickness of 0.2 $\mu$m using a sputtering deposition process or a CVD (chemical vapor deposition) process or the like to form the metal electrode 3. The metal electrode is then anodized to form a metal oxide film having a thickness of about 0.05 to 0.1 $\mu$m as the insulator 2. In this case, the anodizing is performed by using a dilute solution of an acid such as a boric acid, a phosphoric acid, a tartaric acid or the like and their ammonium salt as an electrolyte, dipping the electrode 3-disposed glass substrate into the electrolyte and energizing current using the electrode 3 as anode. Then, a metal having the cavitation-resisting properties is deposited to a width of 40 $\mu$m and a thickness of 0.2 $\mu$m by the sputtering deposition process or the like so as to cross the lower electrode 3, thereby to form the metal electrode 1 having the cavitation-resisting properties and obtain the MIM device 4. As a metal having the cavitation-resisting properties is used for example Ta.

In the MIM device 4, a portion where the bubble 25 is generated, that is a portion which contacts the ink 12 is composed of a metal having the cavitation-resisting properties. Therefore, the MIM device is resistant to the cavitation and no cavitation-resisting layer is required to further form on the metal layer. Accordingly, the distance between the heating portion and the ink contact surface can be decreased. That is, a conventional heating resistor which requires the cavitation-resisting properties must provide an insulating layer between the cavitation-resisting layer and the heating resistor so as to electrically insulate them. Thus, two layers are intervened between the heating resistor and the ink. On the other hand, the MIM device 4 of the present invention does not need an insulating layer and has a configuration that only the metal electrode 1 having cavitation-resisting properties is intervened between the insulator 2 of a heating portion and the ink 12. Accordingly, the distance between the heating portion and the ink contact surface can be reduced by the space of the insulation layer. Thus, the heat conductivity from the heating portion to the ink 12 is enhanced and the ink 12 can be bubbled by reduced consumption electric power.

The heating value of an MIM device depends on only the thickness of the insulator 2 and the material constant as expressed by the equations 1 to 3, and does not depend on the resistance value of the metal electrode 1 having the cavitation-resisting properties. Therefore, higher cavitation-resisting properties can be obtained by sufficiently increasing the film thickness of the metal electrode 1 having the cavitation-resisting properties.

EXAMPLE 2

Figure 5A:
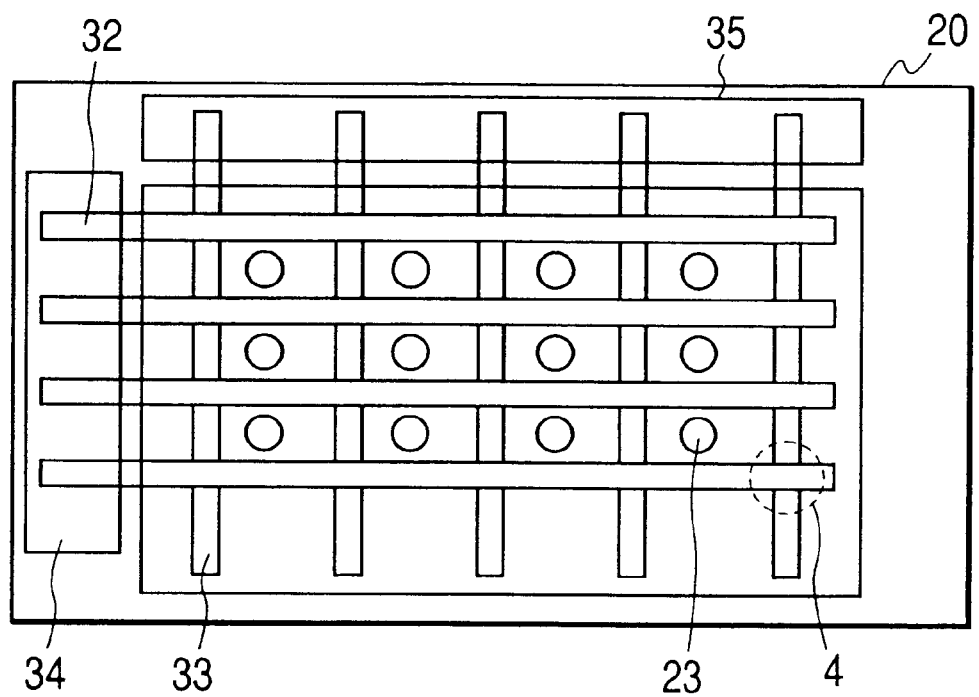
FIGS. 5A and 5B are plan views showing an ink jet recording head according to Example 2 of the present invention.
Figure 5B:
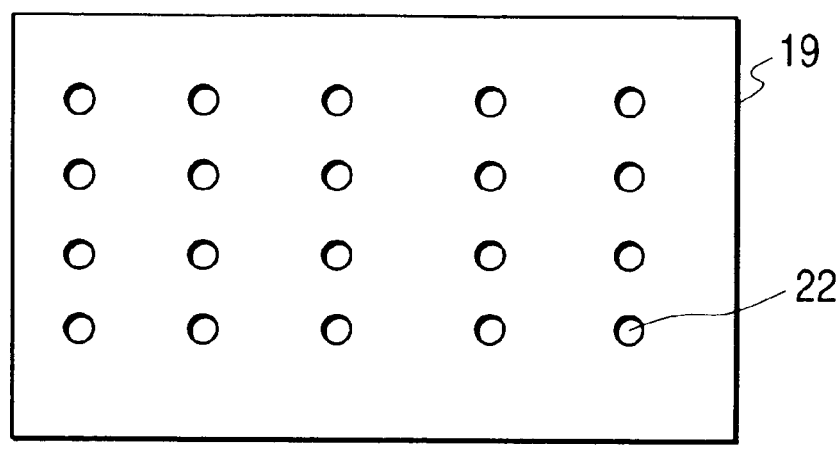

FIGS. 5A and 5B are plan views showing the feature of an ink jet recording head according to Example 2. In FIGS. 5A and 5B the same elements as in Example 1 are denoted by the same reference numerals, and the description thereof is omitted.

As shown in FIG. 5A, on an insulating substrate 20 of the ink jet recording head according to Example 2 are formed a linear stripe-shaped lower electrode 33 extending in a direction vertical to the sheet of FIGS. 5A and 5B, and a linear stripe-shaped upper electrode 32 extending in the transverse direction in FIGS. 5A and 5B and passing through the upper portion of the stripe-shaped lower electrode 33 to cross it, in parallel in a plurality of lines respectively, whereby both stripe-shaped electrodes 32 and 33 are overlapped to form a matrix shape. At the end portion of the stripe-shaped upper electrode 32 is formed an interface electrode portion 34 and at the end portion of the stripe-shaped lower electrode 33 is formed an interface electrode portion 35. The stripe-shaped lower electrode 33 is a metal electrode on whose surface an insulator was formed, and the stripe-shaped upper electrode 32 is an electrode composed of a cavitation-resisting metal. Both electrodes 32 and 33 are formed in the same manner as in Example 1, respectively. On the crossing or intersection area of the stripe-shaped lower electrode 33 and the stripe-shaped upper electrode 32 is formed an MIM device 4. That is, in the present Example, the MIM device 4 is formed in a matrix. Further, discharge ports 22 are perforated in a matrix in a substrate 19 in accordance with the MIM device 4, as shown in FIG. 5B.

A driving method of the MIM device 4 disposed or arranged in a matrix will now be described.

To the stripe-shaped lower electrode 33 and the stripe-shaped upper electrode 32 is selectively applied a voltage from a matrix driving interface of a printer body not shown through the interface electrode portions 34 and 35. That is, when a voltage V1 is applied to one of the plural stripe-shaped lower electrodes 33 and a voltage V2 is applied to one of the plural stripe-shaped upper electrodes 32, a potential difference (V2−V1) is applied to the MIM device 4 on the crossing portion of the V1-applied stripe-shaped lower electrode 33 and the V2-applied stripe-shaped upper electrode 32 to drive the MIM device 4, whereby ink is heated at this portion and the ink is bubbled. Accordingly, an ink droplet is discharged from the corresponding discharge port 22.

In this case, a potential difference V2 is applied to the MIM device 4 other than that on the crossing portion of the V2-applied stripe-shaped lower electrode 33 and the V1-applied stripe-shaped upper electrode 32, and a potential difference V1 is applied to the MIM device 4 other than that on the crossing portion of the V1-applied stripe-shaped upper electrode 32 and the V2-applied stripe-shaped lower electrode 33. However, the MIM device 4 is a nonlinear device and has a large amount of change in current with respect to the change in a potential difference applied as expressed by equation 1. Thus, even though the potential differences V2 or V1 smaller than the potential difference (V2−V1) by which a required heating value can be obtained, is applied, current is hardly flowed and heating is hardly effected. That is, according to the configuration of the present Example, undesired heating value for a non-selected MIM device 4 is small.

As explained above, in the configuration that the MIM device 4 is arranged in a matrix as heating means, even though driving circuits are not provided for the respective heating means disposed in a matrix, the generation of non-required heating is reduced. Therefore, as shown in the present Example, it is easy to form the interface electrode portions 34 and 35 on the periphery of the ink jet recording head. By the provision of such interface electrode portions 34 and 35, the ink jet recording head can have a configuration that it is easily detachable from the driving circuits of the heating means provided in the printer body. According to this configuration, the provision of the driving circuits of the heating means in the ink jet recording head is not required. Accordingly, the configuration of the ink jet recording head which needs replacement due to the consumption of ink can be simplified and the production costs are reduced and a mass production can be effected.

EXAMPLE 3

Figure 6:
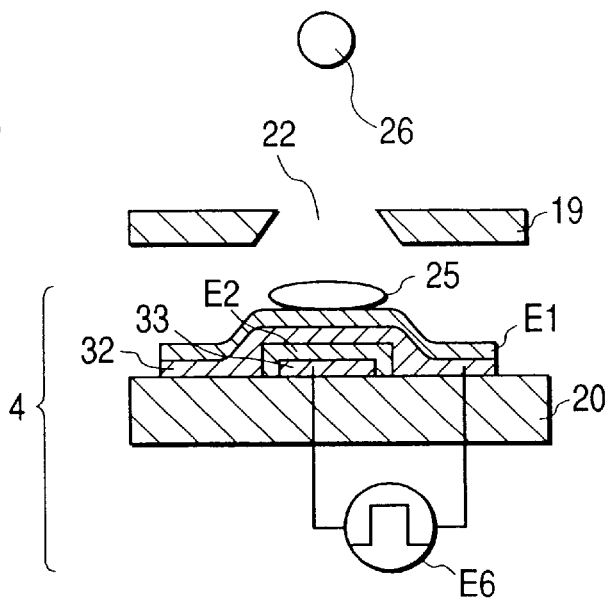
FIG. 6 is a schematic view showing the feature of an ink jet recording head according to Example 3 of the present invention.

FIG. 6 is a schematic view showing the feature of an ink jet recording head of Example 3, and also shows a cross-sectional view of the periphery of an MIM device 4 of the ink jet recording head in which MIM devices 4 were disposed in a matrix as in Example 2. In FIG. 6, the same elements as in Examples 1 and 2 are denoted by the same reference numerals, and the description thereof is omitted.

An ink jet recording head of Example 3 uses a heating device including a stripe-shaped lower electrode 33 composed of metal, an oxide insulating film E2 formed on the electrode 33 by anodizing or thermal oxidizing the surface of the electrode 33, a stripe-shaped upper electrode 32 composed of metal and disposed on the oxide insulating film E2, and an oxide insulating film E1 formed on the electrode 32 by anodizing or thermal oxidizing the surface of the electrode 32. That is, an MIM device 4 includes the stripe-shaped lower electrode 33, an oxide insulating film E2, and the stripe-shaped upper electrode 32, and is formed on the crossing of the stripe-shaped lower electrode 33 and the stripe-shaped upper electrode 32.

As explained above, according to Example 3, on the entire upper surfaces of the stripe-shaped upper electrode 32 and the stripe-shaped lower electrode 33 are formed the oxide insulating films E1 and E2 respectively. Thus, the oxide insulating films E1 and E2 positioned on the liquid contact surfaces of the stripe-shaped upper electrode 32 and the stripe-shaped lower electrode 33 respectively, act as protective films, thereby enhancing the durability of the heating device that is the MIM device. Additionally, since the oxide insulating films E1 and E2 are thermal oxide films or anodized oxide films of metal having the heat resistance, they have a merit of the heat resistance.

A further concrete method of configuring the present Example 3 will now be described.

As the stripe-shaped upper electrode 32 and the stripe-shaped lower electrode 33, an about 150 nm thick Ta thin-film is formed by the RF (radio-frequency, high frequency) sputtering process. As the oxide insulating films E1 and E2, the surfaces of the stripe-shaped upper electrode 32 and the stripe-shaped lower electrode 33 are then oxidized by the anodizing process to form an about 12 nm thick $Ta_2O_5$ thin-film. In this case, the RF sputtering is effected in about $10^{-2}$ Torr Ar gas atmosphere. The electrode width is set to 24 μm, and the size of the electrode for a heater portion of the MIM device 4 is set to 24 μm×24 μm. When a pulse voltage of about 8 V is applied to the MIM device 4, ink is bubbled for about 1 μsec and an ink droplet can be discharged.

EXAMPLE 4

Figure 7A:
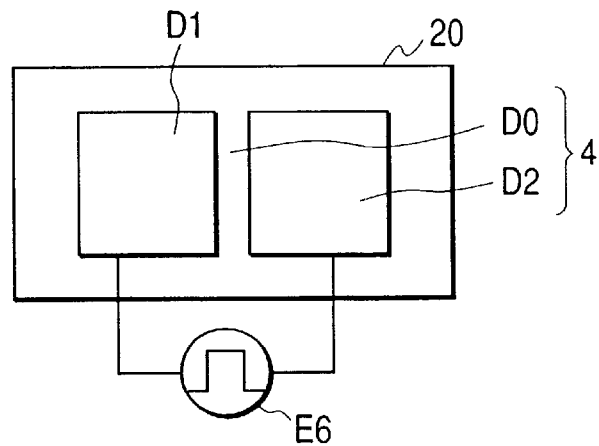
FIGS. 7A and 7B are diagrams showing the feature of an ink jet recording head according to Example 4 of the present invention.
Figure 7B:
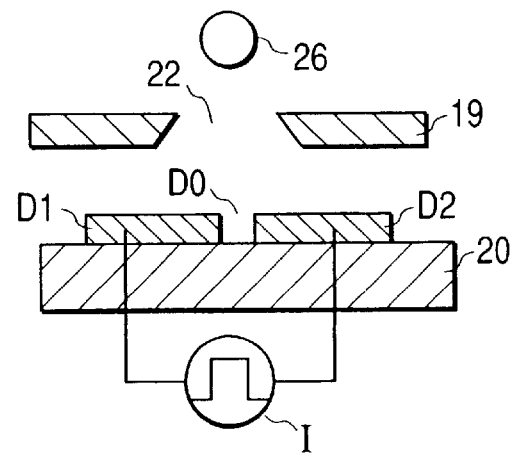

FIGS. 7A and 7B are schematic views showing the feature an ink jet recording head of Example 4, particularly, FIG. 7A shows a plan view of an MIM device 4, and FIG. 7B shows a cross-sectional view of the periphery of the MIM device 4. In FIGS. 7A and 7B, the same elements as in Examples 1 to 3 are denoted by the same reference numerals, and the description thereof is omitted.

As shown in FIGS. 7A and 7B, in the ink jet recording head, a pair of thin-film electrodes D1 and D2 are formed on an insulating substrate 20 with a space of D0. That is, the space D0 plays the role of the insulator in Examples 1 to 3.

The MIM device 4 is formed by the thin-film electrodes D1 and D2 and the space D0. By applying a pulse voltage across the thin-film electrodes D1 and D2 with a pulse power supply E6, a linear space D0 portion is heated to bubble ink, whereby an ink droplet can be discharged.

Incidentally, another insulating thin-film may be formed in the space D0 portion. Alternatively, as the insulating substrate 20, the least surface of the thin-film electrodes D1 and D2 may be an insulator.

As explained above, the ink jet recording head of Example 4 is characterized in that the MIM device 4 and the tunnel junction are formed in a direction parallel to the insulating substrate 20. Even such an MIM device 4 can obtain the same cavitation-resisting properties as that of the laminate MIM device 4 as described in Examples 1 to 3.

EXAMPLE 5

Figure 8:
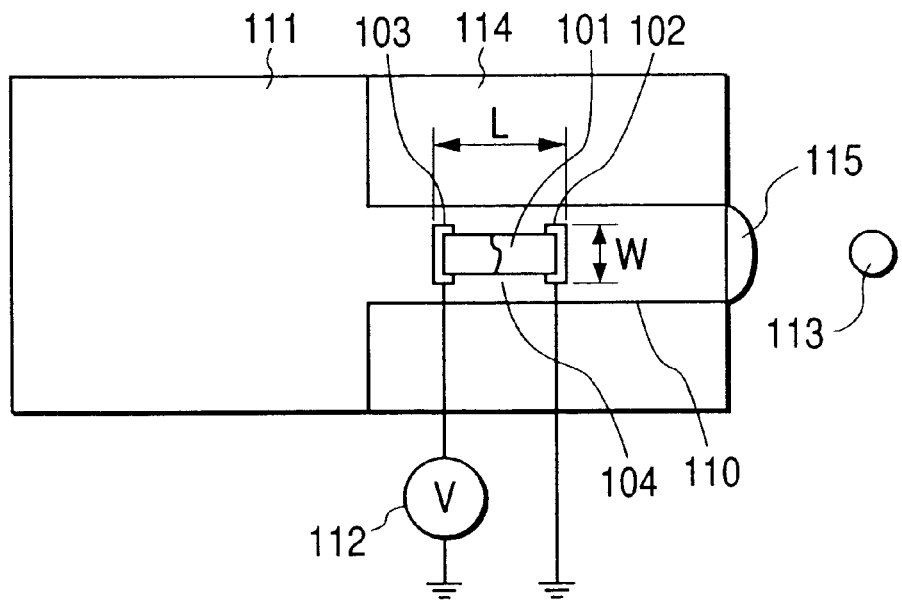
FIG. 8 is a diagram showing a liquid discharge device according to Example 5 of the present invention.

FIG. 8 is a diagram showing a liquid discharge device of Example 5 according to the present invention. In Example 5 shown in FIG. 8, a liquid path 110 is formed on a substrate 114. On a portion of this liquid path 110 is formed a thin-film resistor 101 of a heater. On both sides of the thin-film resistor 101 are provided a pair of device electrodes 102 and 103 which are connected to a power supply 112 for supplying the electrical energy. Further, the liquid path 110 communicates with a liquid chamber 111 for supplying this liquid path 110 with liquid.

When current is flowed from this device electrodes 102 and 103 to the thin-film resistor 101, a linear field-concentrated region 104 as schematically shown in FIG. 8 is generated, and a temperature of the liquid in the liquid path 110 is locally changed to a high temperature in this field-concentrated region 104. A minute bubble is then generated at the place. A fine liquid droplet 113 is discharged from the discharge port 115 of the liquid path by the pressure of bubbling and is adhered to a recording paper or the like.

When a conventional uniform thin-film resistor is used, a bubble is generated over the entire film surface. Thus, when the film area of the thin-film resistor cannot be former in a sufficiently small size, a bubble grows to too large a size and a fine liquid droplet could not be discharged. On the other hand, in the present invention, even when the film area of the thin-film resistor cannot be formed in a sufficiently small size, the field-concentrated region 104 is generated and a region of sufficiently large current functions as a spot-shaped heater, whereby a fine liquid droplet can be discharged.

Figure 9:
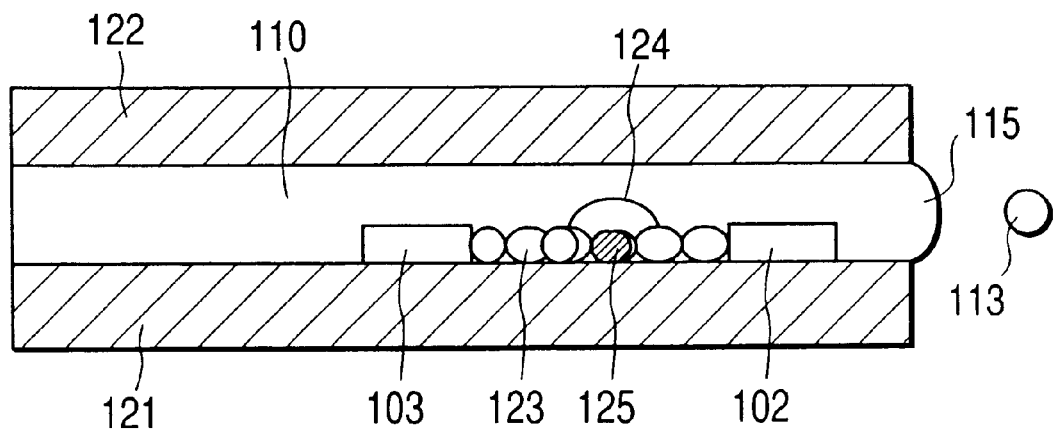
FIG. 9 is a partial cross-sectional view of the vicinity of the liquid path of FIG. 8.

FIG. 9 is a partial cross-sectional view of the periphery of the liquid path of a liquid discharge device of FIG. 8. In the Example shown in FIG. 9, the liquid path 110 is formed between substrates 121 and 122. The thin-film resistor 101 provided on the substrate 121 is formed by a fine particle film composed of a large number of fine particles dispersedly disposed between the device electrodes 102 and 103. Incidentally, the fine particle 123 refers to the aggregate of a large number of atoms and molecules, and it is desirable that the lower limit of the fine particle diameter is about 0.1 nm to 1 nm, and that the upper limit thereof is a few $\mu$m to tens $\mu$m.

As described above, according to the present invention, in the field-concentrated region 104 of the thin-film resistor 101, a temperature of the liquid in the liquid path 110 is locally changed to a high temperature, and a minute bubble is generated at the place. In FIG. 9 a position around the center of the film functions as the spot-shaped heating portion, and a minute bubbling region 124 is formed over the portion.

If the thin-film resistor 101 is a-fine particle film composed of a number of fine particles 123, the area occupation ratio of the fine particles is preferably in a range of 35% to 75%. This area occupation ratio can be obtained by observing the surface image using the scanning electron microscope (SEM) or the like and obtaining the ratio of the area where the fine particles were adhered to the substrate area.

With the linear field-concentrated region 104 in the fine particle film, for example, an electron emission device having a fine particle structure is proposed in Japanese Patent Application Laid-open No. 5-242793. Further, for example, Japanese Patent Application Laid-open No. 10-50208 describes that the field-concentrated region derived from the fluctuation is linearly generated in a fine particle-shaped thin-film.

FIG. 10A is a schematic view showing a structure of a fine particle film having a fluctuation in a range of 35% to 75% of the area occupation ration of a fine particle, and FIG. 10B is a schematic view showing the calculation results of a simulation of the space distribution of an electric field with respect to the fine particle film. As shown in FIG. 10B, a linear field-concentrated region 131 is generated in a fine particle film having a fluctuation.

According to findings of the present invention, the linear field-concentrated region 131 is significantly generated in the vicinity of the osmotic threshold of a fine particle film. This means that the linear field-concentrated region 131 is significantly generated in a region from an insulated state where the conductance of the fine particle film is substantially 0 to a conducted state where it has an infinite value.

The respective members which form the liquid discharge device described above have no limitations particularly in the present invention, and may be appropriately selected as required as long as the members function so that the liquid droplet can be discharged by a minute bubbling n the linear field-concentrated region 131.

As the substrates 121 and 122, a crystal glass, a glass in which a content of impurities such as Na and the like was decreased, a blue plate glass, ceramics such as alumina or the like, silicon or the like can be used.

As the device electrodes 102 and 103, general conductive materials and the like, for example, metals or the alloys such as Ni, Cr, Au, Mo, W, Pt, Ti, Al, Cu, Pd and the like, printing conductors composed of metals or the oxides such as Pd, Ag, Au, $RuO_2$, Pd—Ag and the like, and a glass and the like, transparent conductors such as $In_2O_3$—$SnO_2$ and the like, semiconductor materials such as Polycrystalline silicon etc., and the like can be used.

The space L between the device electrodes, and the length L of the device electrode can be designed in consideration of the configurations to be applied. For example, the space L between the device electrodes can be set to a range from hundreds nm to hundreds $\mu$m.

Further, as the fine particle 123 which forms the thin-film resistor 101, metals such as Bi, Pd, Pt, Ru, Ag, Au, Ti, In, Cu, Cr, Fe, Zn, Sn, Ta, W, Pb and the like, oxides such as PdO, $SnO_2$, $In_2O_3$, PbO, $Sb_2O_3$ and the like, borides such as $HfB_2$, $ZrB_2$, $LaB_6$, $CeB_6$, $YB_4$ and the like, carbides such as TiC, ZrC, HfC, TaC, SiC, WC and the like, nitrides such as TiN, ZrN, HfN and the like, semiconductors such as Si, Ge and the like, carbon, and the like can be used.

As a process of preparing a fine particle film which is the thin-film resistor 101, well-known various processes such as a process of applying and sintering an organic metal having a metal of the fine particle film as a main element as well as deposition processes such as a sputtering process can be used.

Next, further detailed configuration examples of Example 5 will be described.

The liquid discharge device shown in FIG. 8 was prepared under the following conditions. A fine particle film, whose material is Bi, whose mean particle diameter is 9 nm, whose film thickness is 9 mm, and whose area occupation ratio is 67% was formed by a vacuum deposition process. In this case, the current-carrying forming was not performed. Further, as a material of the device electrodes 102 and 103, Pt was used, the space L between the device electrodes was set to 40 μm, the length W of the device electrode was set to 40 μm, as the substrates 121 and 122 a blue plate glass was used, and the size of the liquid path 110 was set to 200 μm (the width of the liquid path was set to 2 μm which is smaller than W).

Using this liquid discharge device, evaluations of the ink jet recording were made with a microscope. As a result, a minute bubbling was found on the linear filed-concentrated region 104 and the discharge of a fine liquid droplet could be effected.

EXAMPLE 6

FIG. 11 is a schematic view showing an example that the liquid discharge device of Example 5 of the present invention, that is, a thin-film resistor has a linear field-concentrated region formed by locally breaking, deforming or altering a thin-film by current-carrying process. In Example 6 shown in FIG. 11, a thin-film re sistor 141 having a field-concentrated region 142 which was formed by the occurrence of a crack is used.

Such a field-concentrated region 142 can be formed by the current-carrying forming. Specifically, the thin-film resistor 141 can be locally broken, deformed or altered by applying a constantly-kept high-valued pulse wave, or applying high-valued pulse wave increasingly, across the device electrodes 102 and 103 using the pulse wave shapes. The pulse width is preferably 1 μs to 10 ms, the pulse gap is preferably in the range of 10 μs to 100 μms, and the pulse application time is preferably a few secs to tens mins.

The completion of the current-carrying forming can be detected by application of a sufficiently small resistance measuring voltage between pulses and measuring the resistance. For example, when a resistance of 1 MΩ or more has been exhibited after the application of a resistance measuring voltage of about 0.1 V, the current-carrying forming may be completed.

In Example 6, even though, for example, a fine particle film is one in which the linear field-concentrated region 131 (FIG. 10B) described in Example 5 has not yet been formed satisfactorily, a field-concentrated region 142 which allows excellent bubbling can be formed by breaking, deforming or altering the film.

A detailed configuration example of Example 6 will now be described.

The liquid discharge device shown in FIG. 11 was prepared under the following conditions. A fine particle film, whose material is PdO, whose mean particle diameter is 10 nm, whose film thickness is 10 mm, and whose area occupation ratio is 95% was formed by a spin-coating process, and the current-carrying forming was performed. Further, the device electrodes 102 and 103, the substrates 121 and 122, and the liquid path 110 were used in same manner as in Example 5.

Using this liquid discharge device, evaluations of the ink jet recording were made with a microscope. As a result, a minute bubbling was found on the linear field-concentrated region 142 and the discharge of a fine liquid droplet could be effected.

EXAMPLE 7

Figure 12A:
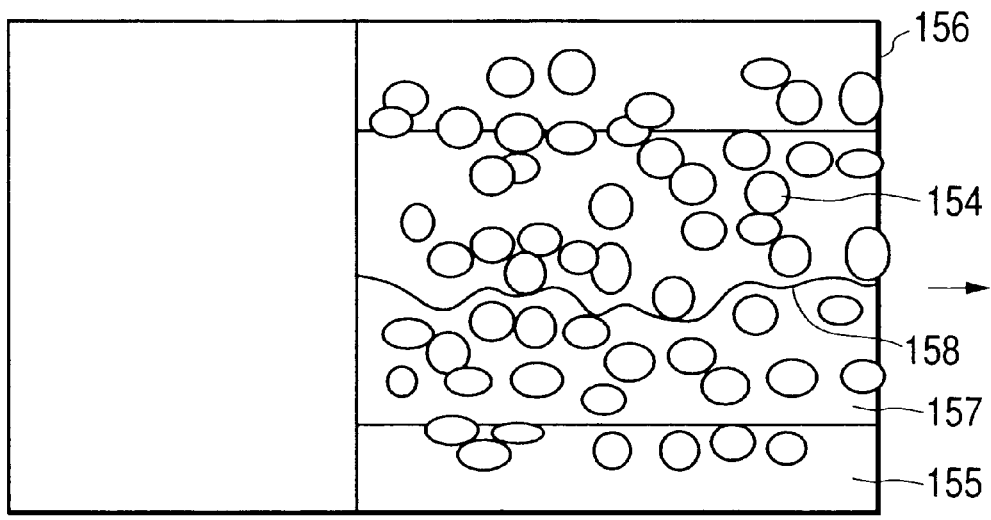
FIGS. 12A and 12B are diagrams showing a liquid discharge device according to Example 7 of the present invention, particularly.
Figure 12B:
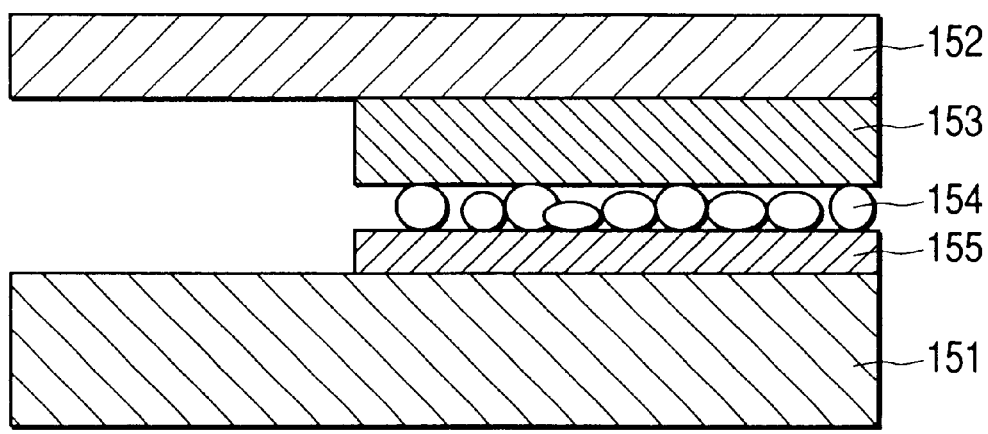

FIGS. 12A and 12B are schematic views showing a liquid discharge device of Example 7 of the present invention, that is, an example using the gaps between fine particles in a fine particle film. Particularly, FIG. 12A is a schematic plan view and FIG. 12B is the cross-sectional view thereof.

In the example shown in FIGS. 12A and 12B, between a device electrodes 155, 156 formed on a lower substrate and an insulating thin-film 157 prepared at the same height as the electrodes, and a spacer 153 provided on an upper substrate 152, is filled a fine particle film 154 which is composed of a number of fine particles as a thin-film resistor and has the area occupation ratio of 35% to 75%.

In this example, gaps between fine particles of the fine particle film 154 become liquid paths of the liquid discharge device. That is, a liquid supplied from the liquid chamber is discharged from a discharge port through the gap portions between the fine particles. Thus, by using the gap portions of the fine particle film 154 as extremely narrow liquid paths and applying a voltage to the fine particle film 154, a linear field-concentrated region 158 is formed. Then, by the local heating in a current-focused spot region on the line, the minute bubbling is effected and a fine liquid droplet is discharged.

In Example 7, since the gap portions of the fine particle fine are used as the liquid paths, extremely narrow paths can be formed.

A detailed configuration example of Example 7 will now be described.

The liquid discharge device having a configuration shown in FIGS. 12A and 12B was prepared under the same conditions as in Example 5, except that the each size of the device electrodes 102 and 103 was changed to a space L of 40 μm and a length W of 100 μm. Using this liquid discharge device, evaluations of the ink jet recording were made with a microscope. As a result, a minute bubbling was found on the linear field-concentrated region 158 and the discharge of a fine liquid droplet could be effected.

Figure 13:
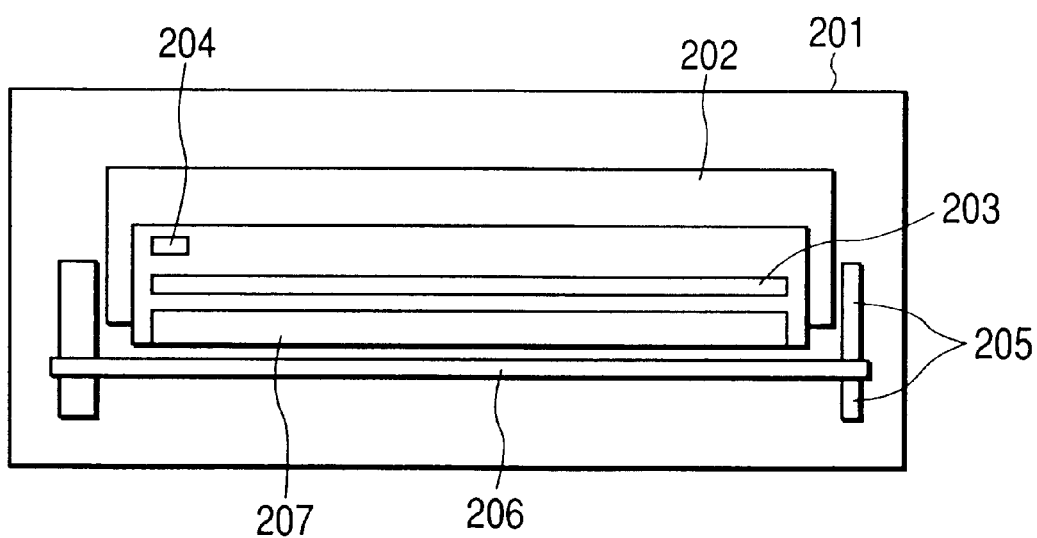
FIG. 13 is a schematic view showing one example of an ink jet recording device in which a liquid discharge device of the present invention was disposed in an array.

One example of an ink jet recording device in which the liquid discharge device described above was disposed in an array, for example, will be schematically shown in FIG. 13. In FIG. 13, the reference numeral 201 denotes a vessel, 202 an ink tank, 203 driving circuits, 204 an interface circuit, 205 a paper carrying roller, 206 a paper, and 207 a liquid discharge device disposed in an array. In the liquid discharge device disposed in an array, minute bubbling is generated on the linear field-concentrated region and a fine liquid droplet is discharged from a discharge port, whereby recording is effected on the paper 206.

What is claimed is:

1. An ink jet recording head for discharging an ink droplet using the thermal energy of heating means, wherein said heating means is a heating device having Metal-Insulator-Metal type current-voltage properties in which the resistance value on the application of a low voltage exhibits a value higher than the resistance value on the application of a high voltage, regardless of the polarity.

2. An ink jet recording head according to claim 1, wherein the absolute value ratio $V_1/V_2$ of an applied voltage $+V_1$ to an applied voltage $-V_2$ to said heating device, which provides current of an absolute value $I_0$ corresponding to the current which is flowed through said heating device when the thermal energy required for bubbling ink is generated, is a value of 0.5 to 2, and that the absolute value of current which is flowed through said heating device when a voltage $+V_1/2$ or $-V_2/2$ is applied to said heating device is $I_0/10$ or less.

3. An ink jet recording head according to claim 1, which has electrodes arranged longitudinally and transversely so as to cross each other, and wherein said heating devices are provided on the crossing of said electrodes, in a matrix.

4. An ink jet recording head according to claim 1, wherein said heating device is composed of an insulator and a pair of conductor electrode sandwiching the insulator.

5. An ink jet recording head according to claim 4, wherein the distance between said pair of said conductor electrodes is 1 nm to 100 nm, and preferably 4 nm to 20 nm.

6. An ink jet recording head according to claim 4, wherein at least one of said conductor electrodes is composed of a metal having cavitation-resisting properties.

7. An ink jet recording head according to claim 4, wherein an oxide insulating film is formed on a surface of said conductor electrode.

8. An ink jet recording head according to claim 4, wherein said heating device has a structure having a pair of thin-film-shaped conductor electrodes spaced on a surface of a substrate, wherein the surface is an insulator.

9. An ink jet recording head according to claim 4, wherein said heating device has a laminate structure having a first thin-film conductor disposed on a substrate, a thin-film-shaped insulator disposed on the conductor electrode, and a second thin-film conductor disposed on the insulator.

10. An ink jet recording head according to claim 9, which has lower electrodes formed in parallel in plural lines, upper electrodes formed in parallel in plural lines so as to cross said lower electrodes, and insulators each sandwiched between said lower electrode and said upper electrode.

11. An ink jet recording head according to claim 10, which has outer voltage applying means and a detachable interface electrode portion on the respective end portions of said lower electrode and said upper electrode.

12. An ink jet recording head according to claim 1, wherein said heating device is a thin-film resistor disposed between a pair of device electrodes, and said thin-film resistor has a linear field concentration region during the energization of current.

13. An ink jet recording head according to claim 12, wherein said thin-film resistor is a fine particle film composed of fine particles dispersedly disposed between a pair of device electrodes, and the area occupation ratio of said fine particles is in a range of 35% to 75%.

14. An ink jet recording head according to claim 13, wherein the gap between fine particles in said fine particle film is used as a liquid path.

15. An ink jet recording head according to claim 12, wherein said thin-film resistor has a linear field-concentrated region formed by locally breaking, deforming or altering the thin-film by using a current-carrying process.

16. An ink jet apparatus comprising at least an ink jet recording head according to claim 1, wherein an ink discharge port for discharging ink faces a surface of a recording medium, and carrying means of the recording medium.

17. An ink jet recording method comprising the steps of applying voltage to heating device having Metal-Insulator-Metal type current-voltage properties in which the resistance value on the application of a low voltage exhibits a value higher than the resistance value on the application of a high voltage, regardless of the polarity, to heat the heating device, and heating ink by the heat of said heating device, to bubble the ink and increase the pressure, thereby to discharge an ink droplet.

18. An ink jet recording method according to claim 17, wherein an ink jet recording head provided with said heating devices in matrix on the crossing of electrodes arranged longitudinally and transversely so as to cross each other, wherein said heating device is selectively heated by selectively applying a voltage to said electrode.

* * * * *

UNITED STATES PATENT AND TRADEMARK OFFICE
CERTIFICATE OF CORRECTION

PATENT NO. : 6,386,685 B1
DATED : May 14, 2002
INVENTOR(S) : Hideyuki Sugioka

It is certified that error appears in the above-identified patent and that said Letters Patent is hereby corrected as shown below:

Column 1,
Line 49, "which" should read -- in which --.

Column 12,
Lines 36 and 37, "the" should be deleted.

Column 14,
Line 46, "Polycrystalline" should read -- polycrystalline --.

Column 16,
Line 11, "a" should be deleted.

Column 17,
Line 12, "electrode" should read -- electrodes --.

Column 18,
Line 24, "heating" should read -- a heating --.

Signed and Sealed this

Twenty-second Day of July, 2003

JAMES E. ROGAN
*Director of the United States Patent and Trademark Office*